US010306732B2

(12) United States Patent
Gotou et al.

(10) Patent No.: US 10,306,732 B2
(45) Date of Patent: May 28, 2019

(54) DIMMER

(71) Applicant: Panasonic Intellectual Property Management Co., Ltd., Osaka (JP)

(72) Inventors: Kiyosi Gotou, Hyogo (JP); Tomohiro Miyake, Mie (JP); Takeo Suzuki, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/580,027

(22) PCT Filed: May 30, 2016

(86) PCT No.: PCT/JP2016/002605
§ 371 (c)(1),
(2) Date: Dec. 6, 2017

(87) PCT Pub. No.: WO2016/199368
PCT Pub. Date: Dec. 15, 2016

(65) Prior Publication Data
US 2018/0153021 A1    May 31, 2018

(30) Foreign Application Priority Data
Jun. 8, 2015   (JP) ................................. 2015-116179

(51) Int. Cl.
*H05B 37/02* (2006.01)
*H05B 33/08* (2006.01)
(Continued)

(52) U.S. Cl.
CPC ..... *H05B 37/0209* (2013.01); *H05B 33/0845* (2013.01); *H03K 17/6871* (2013.01); *H05B 39/048* (2013.01); *H05B 41/3924* (2013.01)

(58) Field of Classification Search
None
See application file for complete search history.

(56) References Cited

U.S. PATENT DOCUMENTS 6,266,260 B1 *  7/2001  Zahrte, Sr. .............. H02J 9/062
                                                   363/132
7,566,996 B2 *  7/2009  Altonen .............. G06F 3/03547
                                                   200/514
(Continued)

FOREIGN PATENT DOCUMENTS

CN    102171623 A     8/2011
CN    102292786 A    12/2011
(Continued)

OTHER PUBLICATIONS

International Search Report and Written Opinion for International Application No. PCT/JP2016/002605, dated Aug. 30, 2016.
(Continued)

*Primary Examiner* — Crystal L Hammond
(74) *Attorney, Agent, or Firm* — Renner Otto Boisselle & Sklar, LLP

(57) ABSTRACT

A bidirectional switch is switched so as to conduct and interrupt a bidirectional current between a pair of input terminals. A power supply is electrically connected between the pair of input terminals and produces control power by electric power from an AC power supply. A controller receives the control power from the power supply to be activated. The controller causes the bidirectional switch to be in an off-state from a start point of a half cycle of AC voltage to a first time point when first time elapses. The controller causes the bidirectional switch to be in an on-state from the first time point to a second time point when second time according to the dimming level elapses. The controller causes the bidirectional switch to be in an off-state from the second time point to an end point of the half cycle.

10 Claims, 7 Drawing Sheets

(51) Int. Cl.
*H03K 17/687* (2006.01)
*H05B 39/04* (2006.01)
*H05B 41/392* (2006.01)

(56) References Cited

U.S. PATENT DOCUMENTS

| | | | |
|---|---|---|---|
| 7,847,440 B2 * | 12/2010 | Mosebrook | H05B 37/0209 307/115 |
| 8,129,976 B2 * | 3/2012 | Blakeley | H05B 39/041 307/139 |
| 8,339,062 B2 | 12/2012 | Cencur | |
| 8,492,988 B2 * | 7/2013 | Nuhfer | H05B 33/0815 315/209 R |
| 9,084,310 B2 * | 7/2015 | Bedell | H05B 37/0227 |
| 9,655,219 B2 * | 5/2017 | Chen | H05B 39/044 |
| RE46,586 E * | 10/2017 | Steiner | |
| 9,795,008 B2 * | 10/2017 | Chen | H05B 37/0227 |
| 9,923,633 B2 * | 3/2018 | Economy | H04B 10/116 |
| 2007/0001654 A1 | 1/2007 | Newman, Jr. | |
| 2007/0146958 A1 * | 6/2007 | Babcock | H02P 7/281 361/160 |
| 2008/0273125 A1 * | 11/2008 | Nishinosono | H05B 41/2855 348/790 |
| 2012/0153930 A1 | 6/2012 | Goto | |
| 2013/0187563 A1 | 7/2013 | Sasai et al. | |
| 2016/0095187 A1 * | 3/2016 | Chen | H05B 39/044 315/155 |

FOREIGN PATENT DOCUMENTS

| | | |
|---|---|---|
| CN | 104322151 A | 1/2016 |
| EP | 1 465 464 A2 | 10/2004 |
| JP | 2011-050149 A | 3/2011 |
| JP | 2013-149498 A | 8/2013 |
| JP | 2013-243082 A | 12/2013 |
| JP | 2013-251189 A | 12/2013 |
| SG | 1722384 A1 | 7/2011 |
| WO | 2010/020855 A1 | 2/2010 |
| WO | WO 2013/148221 A1 | 10/2013 |

OTHER PUBLICATIONS

European Search Report for corresponding European Application No. 16807085.2 dated Jun. 1, 2018.
Chinese Office Action dated Dec. 28, 2018 issued for corresponding Chinese patent application No. 201680033598.1.
U.S. Office Action dated Jan. 11, 2019 issued for corresponding U.S. Appl. No. 16/194,350.
Notice of Reasons for Revocation dated Aug. 22, 2018 for corresponding JP patent No. 6218101.
Notice of Opposition dated Apr. 24, 2018 issued for corresponding Japanese patent No. 6218101.

* cited by examiner

DIMMER

TECHNICAL FIELD

The invention relates to a dimmer configured to adjust the light output of a lighting load.

BACKGROUND ART

In a related dimmer, it has been known to adjust the light output of a lighting load (for example, Patent Literature 1).

A dimmer described in Patent Literature 1 includes a pair of terminals, a control circuit, a control power supply that is configured to supply the control circuit with control power, and a dimming operation device that is configured to set a dimming level of a lighting load.

The control circuit and the control power supply are connected in parallel between the pair of terminals. A series circuit of an AC power supply and the lighting load is to be connected between the pair of terminals. The lighting load includes a plurality of LED (Light Emitting Diode) devices, and a power supply circuit that is configured to light each LED device. The power supply circuit includes a smoothing circuit of a diode and an electrolytic capacitor.

The control circuit includes a switch that is configured to perform phase control of AC voltage to be supplied to the lighting load, a switch driver that is configured to drive the switch, and a controller that is configured to control the switch driver and the control power supply.

The control power supply is connected in parallel with the switch. The control power supply converts the AC voltage of the AC power supply into the control power. The control power supply includes an electrolytic capacitor that is configured to store the control power.

The controller is supplied with the control power through the electrolytic capacitor from the control power supply. The controller includes a microcomputer. The microcomputer is configured to perform reverse phase control by interrupting the supply of electric power to the lighting load at an intermediate time point in each half cycle of AC voltage.

CITATION LIST

Patent Literature

Patent Literature 1: JP 2013-149498 A

SUMMARY OF INVENTION

It is an object of the present invention to provide a dimmer compatible with more kinds of loads.

A dimmer according to a first aspect of the present invention includes a pair of input terminals, a bidirectional switch, a phase detector, an input device, a power supply and a controller. The pair of input terminals is configured to be electrically connected between a load configured to be lit when it is energized, and an AC power supply. The bidirectional switch is configured to be switched so as to conduct and interrupt a bidirectional current between the pair of input terminals. The phase detector is configured to detect a phase of AC voltage of the AC power supply. The input device is configured to receive a dimming level representing a value of light output of the load. The power supply is electrically connected between the pair of input terminals and configured to receive electric power from the AC power supply to produce control power. The controller is configured to receive the control power from the power supply to be activated. The controller is configured to control the bidirectional switch based on a detection signal from the phase detector so that the bidirectional switch is in an off-state from a start point of a half cycle of the AC voltage to a first time point when first time therefrom elapses, the bidirectional switch is in an on-state from the first time point to a second time point when second time therefrom according to the dimming level elapses, and the bidirectional switch is in an off-state from the second time point to an end point of the half cycle.

A dimmer according to a second aspect of the present invention includes a bidirectional switch, a phase detector, a power supply and a controller. The bidirectional switch is configured to be connected to an AC power supply with the bidirectional switch connected in series to a load, and configured to perform phase control of AC voltage of the AC power supply to be supplied to the load. The phase detector is configured to detect a phase of the AC voltage of the AC power supply. The power supply is connected in parallel with the bidirectional switch, and configured to perform conversion operation to convert the AC power supply into prescribed control power. The power supply has a capacitive device configured to store the control power. The controller is configured to receive the control power through the capacitive device from the power supply. The controller is configured to divide each half cycle of the AC voltage into a first time period, a second time period, a third time period and a fourth time period based on the phase detected with the phase detector. The controller is also configured to, during the first and fourth time periods, modulate the bidirectional switch out of conduction to interrupt supply of electric power to the load, and cause the power supply to perform the conversion operation. The controller is also configured to, during the second time period, modulate the bidirectional switch into conduction to supply electric power to the load, and stop the power supply performing the conversion operation. The controller is also configured to, during the third time period, modulate the bidirectional switch out of conduction to interrupt the supply of electric power to the load.

DESCRIPTION OF EMBODIMENTS (Embodiment1)
(1.1) Configuration

Figure 1:
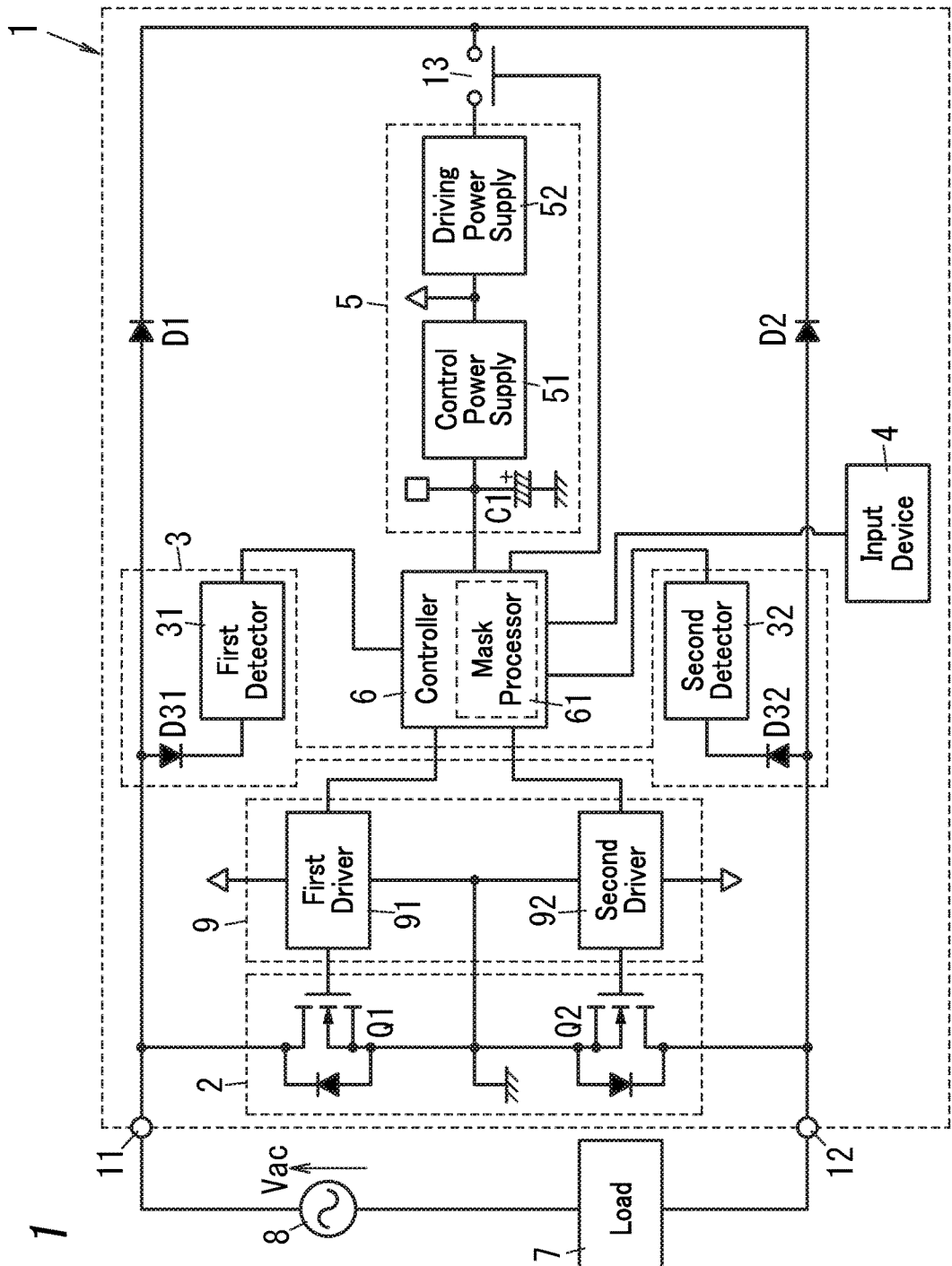
FIG. 1 is a schematic circuit diagram showing a configuration of a dimmer according to Embodiment 1.

A dimmer 1 according to the present embodiment will hereinafter be explained. Note that the configuration to be explained below is merely one example of the present invention, and the present invention is not limited by the embodiment described below, but various modifications may be made therein according to design and the like as long as they are even modifications other than the embodiment and fall within the scope of technical ideas of the present invention. As shown in FIG. 1, the dimmer 1 according to the present embodiment includes a pair of input terminals 11 and 12, a bidirectional switch 2, a phase detector 3, an input device 4, a power supply 5, a controller 6, a switch driver 9, diodes D1 and D2, and a stopper 13.

The pair of input terminals 11 and 12 is configured to be electrically connected between a load 7 configured to be lit when it is energized, and an AC power supply 8. The bidirectional switch 2 is configured to be switched so as to conduct and interrupt (cut off) a bidirectional current between the pair of input terminals 11 and 12. The phase detector 3 is configured to detect a phase of AC voltage Vac of the AC power supply 8. The input device 4 is configured to receive a dimming level representing a value of light output of the load 7. The power supply 5 is electrically connected between the pair of input terminals 11 and 12, and is configured to receive electric power from the AC power supply 8 to produce control power.

The controller 6 is configured to receive the control power supplied from the power supply 5 to be activated. The controller 6 is configured to control the bidirectional switch 2 based on a detection signal from the phase detector 3 so that the bidirectional switch 2 is in an off-state from a start point of a half cycle of the AC voltage Vac to a first time point when first time therefrom elapses, the bidirectional switch 2 is in an on-state from the first time point to a second time point when second time therefrom according to the dimming level elapses, and the bidirectional switch 2 is in an off-state from the second time point to an end time point of the half cycle.

Here, the expression of "from a time point A" means that the time point A is included. For example, "from the first time point" means that the first time point is included. On the other hand, the expression of "to a time point A" means just before the time point A and the time point A is not included. For example, "to a first time point" means just before the first time point and the first time point is not included. Moreover, the "input terminals" may be, for example, leads of electronic components or part of conductor included in a circuit board, and needn't have entity as parts (terminals) to be connected with electric wires or the like.

The dimmer 1 is a two-wire type of dimmer, and used so that the dimmer 1 is connected to the AC power supply 8 with the dimmer 1 electrically connected in series to the load 7. The load 7 is lit when it is energized. The load 7 includes (an) LED devices as a light source, and a lighting circuit configured to light the LED devices. The AC power supply 8 is, for example a 100 [V] 60 [Hz] single phase commercial power supply. The dimmer 1 is applicable to a wall switch as one example or the like.

The bidirectional switch 2 is composed of, for example, two devices such as first and second switch devices Q1 and Q2 that are electrically connected in series between the pair of input terminals 11 and 12. For example, each of the first and second switch devices Q1 and Q2 is a semiconductor switch device such as an n-channel enhancement MOSFET (Metal-Oxide-Semiconductor Field Effect Transistor).

The switch devices Q1 and Q2 are anti-series connected between the pair of input terminals 11 and 12. That is, the switch devices Q1 and Q2 have respective sources that are connected to each other. The switch device Q1 has a drain that is connected to the input terminal 11, and the switch device Q2 has a drain that is connected to the input terminal 12. The sources of the switch devices Q1 and Q2 are connected to ground (earth) of the power supply 5. The ground (earth) of the power supply 5 functions as reference potential of (an) internal circuits of the dimmer 1.

The bidirectional switch 2 can switch among four states by combinations of ON and OFF of the switch devices Q1 and Q2. The four states include a bidirectional off-state in which both the switch devices Q1 and Q2 are off, a bidirectional on-state in which both the switch devices Q1 and Q2 are on, and two kinds of unidirectional on-states in each of which only one of the switch devices Q1 and Q2 is on. With a unidirectional on-state, between the pair of input terminals 11 and 12 is formed a unidirectional conduction from a switch device, which is on, of the switch devices Q1 and Q2 through a body diode of a switch device, which is off, of the switch devices Q1 and Q2. For example, when the switch devices Q1 and Q2 are on and off, respectively, a first unidirectional on-state is formed so as to allow an electric current to flow from the input terminal 11 to the input terminal 12. When the switch devices Q1 and Q2 are off and on, respectively, a second unidirectional on-state is formed so as to allow an electric current to flow from the input terminal 12 to the input terminal 11. Therefore, when the AC voltage Vac is applied between the input terminals 11 and 12 from the AC power supply 8, the first unidirectional on-state and the second unidirectional on-state are a "forward on-state" and a "reverse on-state", respectively, during positive AC voltage Vac, namely during a positive half cycle on a side of the input terminal 11. On the other hand, during negative AC voltage Vac, namely during a positive half cycle on a side of the input terminal 12, the first unidirectional on-state and the second unidirectional on-state are "reverse on-state" and "forward on-state", respectively.

Here, the bidirectional switch 2 is in an on-state in the case of both the "bidirectional on-state" and the "forward on-state", and is in an off-state in the case of both the "bidirectional off-state" and the "reverse on-state".

The phase detector 3 is configured to detect a phase of the AC voltage Vac applied between the input terminals 11 and 12. Herein, examples of the "phase" include a zero cross point of the AC voltage Vac, and respective polarity of the AC voltage Vac (positive polarity and negative polarity). The phase detector 3 is configured to provide the controller 6 with a detection signal when detecting a zero cross point of the AC voltage Vac. The phase detector 3 has a diode D31, a first detector 31, a diode D32 and a second detector 32. The first detector 31 is electrically connected to the input terminal 11 via the diode D31. The second detector 32 is electrically connected to the input terminal 12 via the diode D32. The first detector 31 is configured to detect a zero cross point when the AC voltage Vac shifts from a negative half cycle to a positive half cycle. The second detector 32 is configured to detect a zero cross point when the AC voltage Vac shifts from a positive half cycle to a negative half cycle.

That is, the first detector 31 detects a zero cross point when detecting that positive voltage on the input terminal 11 shifts from a state less than a specified value to a state greater than or equal to the specified value. Similarly, the second detector 32 detects a zero cross point when detecting that positive voltage on the input terminal 12 shifts from a state less than a specified value to a state greater than or equal to the specified value. The specified values are values (absolute values) that are set to approximately 0 [V]. For example, the specified value of the first detector 31 is about positive several volts, and the specified value of the second detector 32 is about negative several volts. Strictly speaking, a detection time point of the zero cross point detected with the first and second detectors 31 and 32 is slightly delayed from the zero cross point (0 [V]).

The input device 4 is configured to receive a signal representing a dimming level from an operation device to be operated by a user to provide the controller 6 with the signal as a dimming signal. Before outputting the dimming signal, the input device 4 may process the signal received, or may omit to process it. The dimming signal is a numerical value or the like representing a value of light output from the load 7, and may include an "OFF level" that forces the load 7 to be unlit. The operation device needs to be configured to receive user's operation to provide the input device 4 with a signal representing a dimming level, and examples thereof include a variable resistor, a rotary switch, a touch panel, a remote controller, a communication terminal such as a smartphone, and the like.

The controller 6 is configured to control the bidirectional switch 2 based on the detection signal from the phase detector 3 and the dimming signal from the input device 4. The controller 6 is configured to individually control the switch devices Q1 and Q2. Specifically, the controller 6 is to control the switch device Q1 according to a first control signal and control the switch device Q2 according to a second control signal.

For example, the controller 6 is mainly composed of a microcomputer. The microcomputer includes a CPU (Central Processing Unit) that executes a program stored in a memory of the microcomputer, thereby functioning as the controller 6. The program may be stored in the memory of the microcomputer in advance, provided through a storage medium such as a memory card, or provided through a telecommunications line. In other words, the program is provided for causing a computer (here, microcomputer) to function as the controller 6.

The switch driver 9 has a first driver 91 configured to drive (perform On and Off control of) the switch device Q1, and a second driver 92 configured to drive (perform On and Off control of) the switch device Q2. The first driver 91 is configured to receive the first control signal from the controller 6 to apply gate voltage to the switch device Q1. The first driver 91 accordingly performs the On and Off control of the switch device Q1. Similarly, the second driver 92 is configured to receive the second control signal from the controller 6 to apply gate voltage to the switch device Q2. The second driver 92 accordingly performs the On and Off control of the switch device Q2. The first driver 91 is configured to produce the gate voltage on the basis of source potential of the switch device Q1. The second driver 92 is similar thereto.

The power supply 5 has a control power supply 51 configured to produce control power, a driving power supply 52 configured to produce driving power, and a capacitive device (capacitor) C1. The control power is power for activating the controller 6. The driving power is power for driving the switch driver 9. The capacitive device C1 is electrically connected to an output terminal of the control power supply 51, and is to be charged by an output current of the control power supply 51.

The power supply 5 is electrically connected to the input terminal 11 through the diode D1, and electrically connected to the input terminal 12 through the diode D2. The AC voltage Vac applied between the input terminals 11 and 12 is accordingly supplied to the power supply 5 after being full-wave rectified by a diode bridge that is composed of the pair of diodes D1 and D2 and respective body diodes of the switch devices Q1 and Q2. The driving power supply 52 smooths the AC voltage Vac full-wave rectified to produce the driving power. The driving power supply 52 supplies the driving power to the switch driver 9 and the control power supply 51. The driving power has, for example the voltage of 10 [V]. The control power supply 51 steps down the driving power supplied from the driving power supply 52 to produce the control power, providing the control power to the capacitive device C1. The control power has, for example the voltage of 3 [V]. The control power supply 51 may directly produce the control power from the AC voltage Vac full-wave rectified, not through the driving power supply 52. In short, the power supply 5 is configured to receive electric power from the AC power supply 8 to produce the control power and the driving power.

The stopper 13 is configured to stop the power supply 5 producing the control power during a stop time period. In the present embodiment, the stopper 13 stops the power supply 5 producing the control power by electrically disconnecting the power supply 5 or controlling a semiconductor switch device included in the power supply 5. In the example of FIG. 1, the stopper 13 forms a series circuit along with the power supply 5, and the series circuit of the stopper 13 and the power supply 5 is electrically connected in parallel with the bidirectional switch 2 between the pair of input terminals 11 and 12. Although the stop time period will be explained in "(1.2.2) Dimming operation" in detail, the stop time period is a period of time from which at least a period of time during which the bidirectional switch 2 is in the bidirectional off-state is excluded. Specifically, the stopper 13 is a switch that is electrically connected between a junction of the pair of diodes D1 and D2 and the power supply 5, and configured to turn off when receiving a disconnection signal from the controller 6 and disconnect the power supply 5 from the input terminals 11 and 12.

The dimmer 1 according to the present embodiment includes a mask processor 61. The mask processor 61 is configured to, when receiving a detection signal from the phase detector 3, disable the detection signal over a constant length of mask time. In the embodiment, the controller 6 is integrally provided with the mask processor 61 as one function of the controller 6. Although the mask processor 61 will be explained in "(1.2.2) Dimming operation" in detail, the mask processor 61 disables the detection signal from the phase detector 3 during the mask time, and thereby the controller 6 hardly receives the influence of errors in detection of the zero cross point by the phase detector 3. Preferably, the mask processor 61 individually disables respective detection signals of the first and second detectors 31 and 32.

The lighting circuit of the load 7 is configured to read a dimming level from a waveform of the AC voltage Vac phase-controlled with the dimmer 1 and vary a value of the light output of the LED devices. Here, as an example, the lighting circuit has a circuit for securing an electric current such as a bleeder circuit. The lighting circuit therefore enables an electric current to flow through the load 7 even when the bidirectional switch 2 of the dimmer 1 does not conduct.

(1.2) Operation (1.2.1) Activation Operation

First, an activation operation of the dimmer 1 according to the present embodiment when it is initially energized will be explained.

With the dimmer 1 configured as stated above, when the AC power supply 8 is connected between the input terminals 11 and 12 through the load 7, the AC voltage Vac applied between the input terminals 11 and 12 from the AC power supply 8 is rectified and then supplied to the driving power supply 52. Driving power is produced through the driving power supply 52 and supplied to the switch driver 9 and the control power supply 51. Control power is produced through the control power supply 51 and supplied to the controller 6, and thereby the controller 6 is activated.

When the controller 6 is activated, the controller 6 judges a frequency of the AC power supply 8 based on detection signals from the phase detector 3. The controller 6 then refers to a numerical value table that is stored in the memory in advance according to the frequency judged, and performs the setting of parameters for various kinds of time (for example, mask time and stop time period to be described later). Here, when a dimming level received through the input device 4 is an "OFF level", the controller 6 keeps a bidirectional off-state of the bidirectional switch 2, thereby keeping a high impedance state of the impedance between the pair of input terminals 11 and 12. The load 7 accordingly keeps an unlit state.

(1.2.2) Dimming Operation

Figure 2:
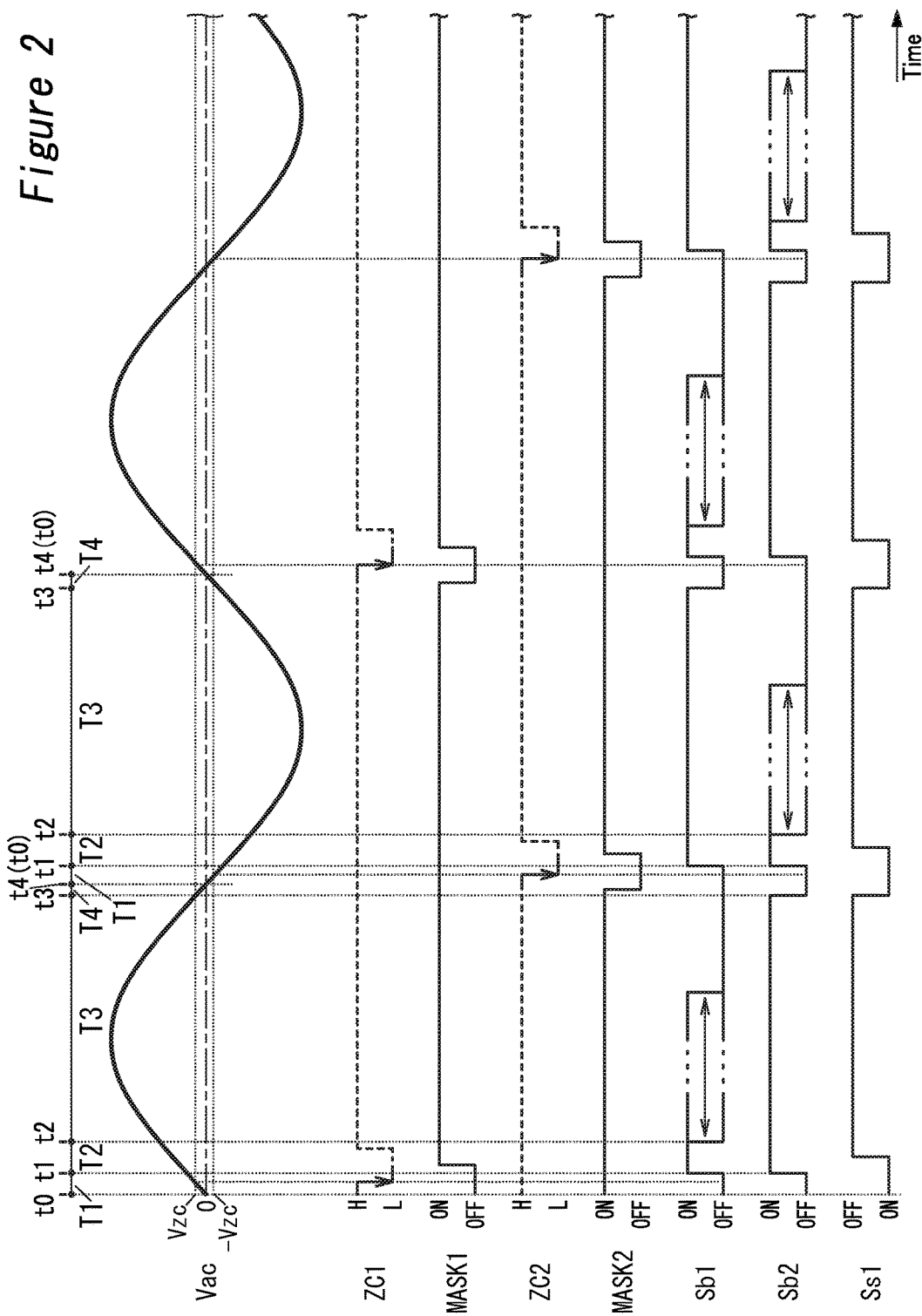
FIG. 2 is a timing chart showing an operation of the dimmer according to Embodiment 1.

The dimming operation of the dimmer 1 according to the present embodiment will next be explained with reference to FIG. 2. FIG. 2 depicts the AC voltage "Vac", the first detection signal "ZC1", first mask processing "MASK 1", the second detection signal "ZC2", second mask processing "MASK2", the first control signal "Sb1", the second control signal "Sb2", and the disconnection signal "Ss1". Here, the first detection signal ZC1 is a detection signal by the first detector 31, and the second detection signal ZC2 is a detection signal by the second detector 32. The first mask processing MASK 1 is mask processing (disabling processing) of the first detection signal ZC1 through the mask processor 61, and the second mask processing MASK 2 is mask processing of the second detection signal ZC2 through the mask processor 61. Herein, the first detection signal ZC1 changing from an "H" level to an "L" level is regarded as the first detection signal ZC1 being generated. In addition, the second detection signal ZC2 changing from an "H" level to an "L" level is regarded as the second detection signal ZC2 being generated. That is, each of the first and second detection signals ZC1 and ZC2 is a signal that changes from an "H" level to an "L" level when a zero cross point is detected.

First, an operation of the dimmer 1 during a positive half cycle of the AC voltage Vac will be explained. The dimmer 1 detects a zero cross point of the AC voltage Vac as a standard of the phase control through the phase detector 3. When the AC voltage Vac shifts from a negative half cycle to a positive half cycle to reach the specified value "Vzc", the first detector 31 outputs a first detection signal ZC1. When receiving the first detection signal ZC1, the controller 6 outputs first and second control signals Sb1 and Sb2 each of which is an "OFF" signal.

Both the switch devices Q1 and A2 are accordingly off and the bidirectional switch 2 is in a bidirectional off-state, during a first time period T1 from a start point of the half cycle (zero cross point) t0 to a first time point t1 when first time therefrom elapses. In the present embodiment, a point in time when the first detection signal ZC1 is generated is regarded as a "detection point", and a sum of a period of time from the start point of the half cycle (zero cross point) t0 to the detection point and a period of time from the detection point to a point in time when a constant time (e.g., 300 [μs]) therefrom elapses is regarded as the first time period T1. That is, in the embodiment, the controller 6 controls to cause the bidirectional switch 2 to be in a bidirectional off-state not only on and after the detection point but also during the period of time from the start point of the half cycle (zero cross point) t0 to the detection point. Here, if the AC voltage Vac has a constant frequency, each period of time from a start point of the half cycle (zero cross point) t0 to a detection point is a constant length of time, and therefore the first time (period of time from start point of half cycle, to, to first time point t1) is a constant length of time.

At the point in time when the constant time (e.g., 300 [μs]) elapses from the detection point, namely the first time point t1, the controller 6 outputs the first and second control signals Sb1 and Sb2 each of which is an "ON" signal.

A second time point t2 is a point in time at which second time from the first time point t1 according to a dimming signal elapses. At the second time point t2, the controller 6 changes the first control signal Sb1 to an "OFF" signal while keeping the second control signal Sb2 that is the "ON" signal. During a second time period T2 from the first time point t1 to the second time point t2, both the switch devices Q1 and Q2 are on and the bidirectional switch 2 is in a bidirectional on-state. The load 7 is therefore supplied with electric power through the bidirectional switch 2 from the AC power supply 8 to be lit.

A third time point t3 is a point in time that is earlier by a constant time (e.g., 300 [μs]) than an end point of the half cycle (zero cross point) t4. At the third time point t3, the controller 6 causes both the first and second control signals Sb1 and Sb2 to be "OFF" signals. Accordingly, during a third time period T3 from the second time point t2 to the third time point t3, only the switch device Q1 of the switch devices Q1 and Q2 is off and the bidirectional switch 2 is in a reverse on-state (i.e., in OFF state). Electric power from the AC power supply 8 to the load 7 is cut off during the third time period T3.

During a fourth time period T4 from the third time point t3 to the end point of the half cycle (zero cross point) t4, both the switch devices Q1 and Q2 are off and the bidirectional switch 2 is in a bidirectional off-state.

An operation of the dimmer 1 during a negative half cycle of the AC voltage Vac is basically similar to the operation of the positive half cycle.

In the negative half cycle, a period of time from a start point of the half cycle (zero cross point) t0 (t4) to a first time point t1 when first time therefrom elapses is regarded as a first time period T1. In the present embodiment, a point in time when a second detection signal ZC2 is generated is regarded as a "detection point", and a sum of a period of time from the start point of the half cycle (zero cross point) t0 (t4) to the detection point and a period of time from the detection point to a point in time when a constant time (e.g., 300 [μs]) therefrom elapses is regarded as the first time period T1. A second time point t2 is a point in time when second time from the first time point t1 according to the dimming signal elapses. A third time point t3 is a point in time that is earlier by a constant time (e.g., 300 [μs]) than an end point of the half cycle (zero cross point) t4 (t0). When the AC voltage Vac reaches a negative specified value "−Vzc", the second detector 32 outputs the second detection signal ZC2. When receiving the second detection signal ZC2, the controller 6 causes the first and second control signals Sb1 and Sb2 to be "OFF" signals. The bidirectional switch 2 is accordingly in a bidirectional off-state during the first time period T1. At the first time point t1, the controller 6 outputs the first and second control signals Sb1 and Sb2 each of which is an "ON" signal.

At the second time point t2, the controller 6 changes the second control signal Sb2 to an "OFF" signal while keeping the first control signal Sb1 that is the "ON" signal. During a second time period T2 from the first time point t1 to the second time point t2, both the switch devices Q1 and Q2 are on and the bidirectional switch 2 is in a bidirectional on-state. The load 7 is therefore supplied with electric power through the bidirectional switch 2 from the AC power supply 8 to be lit, during the second time period T2.

At the third time point t3, the controller 6 causes the first and second control signals Sb1 and Sb2 to be "OFF" signals. Accordingly, during a third time period T3 from the second time point t2 to the third time point t3, only the switch device Q2 of the switch devices Q1 and Q2 is off and the bidirectional switch 2 is in a reverse on-state (i.e., in off state). Electric power from the AC power supply 8 to the load 7 is therefore cut off during the third time period T3.

The dimer 1 according to the present embodiment performs the dimming of the load 7 by alternately repeating the operations of the positive and negative half cycles of the AC voltage Vac as explained above. The bidirectional switch is in an off state during a period of time from a start point of a half cycle (zero cross point) t0 to a first time point t1. The bidirectional switch is also in an off state during a period of time from a second time point t2 to an end point of the half cycle (zero cross point) t4. Therefore, when focusing on two successive half cycles, the bidirectional switch is in an off state from a second time point t2 in a first half cycle to a first time point t1 in the next half cycle (i.e., second half cycle).

Here, since the time from the first time point t1 to the second time point t2 (second time) is time according to the dimming level received through the input device 4, time of conduction between the input terminals 11 and 12 in the half cycle is defined by the dimming level. That is, a short second time makes the light output of the load 7 small, and a long second time makes the light output of the load 7 large. The dimming level to be received by the input device 4 accordingly enables varying the light output of the load 7. Before and after a zero cross point of the AC voltage Vac, the bidirectional switch 2 is within a period of time (first time period T1 or fourth time period T4) during which the bidirectional switch 2 is in a bidirectional off-state, and the dimmer 1 can therefore secure the supply of electric power from the AC power supply 8 to the power supply 5 during the period of time. The present embodiment enables securing the supply of electric power from the AC power supply 8 to the power supply 5 during at least one of the first time period T1 and the fourth time period T4. Note that when a user operates the operation device to adjust the light output of the load 7 to maximum, the second time period T2 may be adjusted to a period of time that is shorter than a length of time that makes the light output maximum with the first time period T1 and the fourth time period T4 preferentially secured.

The dimmer 1 according to the present embodiment includes the mask processor 61, and is configured to perform mask processing of disabling a detection signal of a zero cross point over a constant length of mask time on and after receiving the detection signal of the zero cross point. That is, after receiving a first detection signal ZC1 from the first detector 31, the mask processor 61 sets the first mask processing MASK1 to "ON" to disable the first detection signal ZC1 until the mask time elapses. Similarly, after receiving the second detection signal ZC2 from the second detector 32, the mask processor 61 sets the second mask processing MASK2 to "ON" to disable the second detection signal ZC2 until the mask time elapses. The length of the mask time is set on the basis of the half cycle of the AC voltage Vac. Herein, as an example, the mask time is set to time slightly shorter than twice the length of the half cycle (i.e., one cycle). In FIG. 2, the first and second detection signals ZC1 and ZC2 disabled are shown by dashed lines.

Once a zero cross point is detected, the mask processing is applied up to the vicinity of a next zero cross point. For example, even when a zero cross point is detected in error due to the influence of noise at a point in time of ¼ cycle from the detection of a zero cross point, a detection signal detected in error is disabled by the mask processing. The controller 6 therefore hardly receives the influence of the zero cross point detected in error by the phase detector 3.

The dimmer 1 according to the present embodiment is configured to control the stopper 13 by the disconnection signal Ss1. During the stop time period, the stopper 13 electrically disconnects the power supply 5 or controls the semiconductor switch included in the power supply 5, thereby stopping the power supply 5 producing the control power. That is, during the stop time period, the controller 6 outputs a disconnection signal Ss1 as an "OFF" signal to turn the stopper 13 off, thereby disconnecting the power supply 5 from the input terminals 11 and 12. The stop time period is a period of time from which at least a period of time during which the bidirectional switch 2 is in a bidirectional off-state (first time period T1 or fourth time period T4) is excluded. The stop time period is set in a range of the second time period T2 during which the bidirectional switch 2 is in the bidirectional on-state and the third time period T3 during which the bidirectional switch 2 is in the unidirectional on-state (reverse on-state). Herein, as an example, the stop time period is set so that a point in time between the first time point t1 and the second time point t2 is regarded as a start point thereof and the third time point t3 is regarded as an end point thereof. That is, the stop time period is set to be in a period of time having a possibility that electric power will be supplied from the AC power supply 8 to the load 7.

The dimmer 1 can therefore maintain a high impedance between the input terminals 11 and 12 by an amount as a result of the disconnection of the power supply 5 from the input terminals 11 and 12 during the stop time period. That is, the dimmer 1 can supply the power supply 5 with electric power from the AC power supply 8 for a period of time during which the bidirectional switch 2 is in a bidirectional off-state, and maintain a high impedance between the input terminals 11 and 12 for a period of time during which electric power is not supplied to the power supply 5 (stop time period). For example, the high impedance between the input terminals 11 and 12 is maintained for the third time period T3 during which the bidirectional switch 2 is in a reverse on-state, thereby preventing electric power caused by a leakage circuit from being supplied to the load 7. It is accordingly possible to vary a value of light output of the load 7 according to a small change of the dimming level and improve responsiveness of the load 7.

(1.3) Brief of Dimmer According to Embodiment 1

As explained above, the dimmer 1 according to the present embodiment includes the bidirectional switch 2, the phase detector 3, the power supply 5 and the controller 6.

The bidirectional switch 2 is configured to be connected to the AC power supply 8 with the bidirectional switch 2 connected in series to the load 7, and perform the phase control of the AC voltage Vac to be supplied to the load 7. The phase detector 3 is configured to detect a phase of the AC voltage Vac of the AC power supply 8. The power supply 5 is connected in parallel with the bidirectional switch 2, and is configured to perform a conversion operation to convert the AC power supply 8 into prescribed control power. The power supply 5 has the capacitive device C1 configured to store the control power.

The controller 6 is configured to be supplied with the control power through the capacitive device C1 from the power supply 5, and divide each half cycle of the AC voltage Vac into the first time period T1, the second time period T2, the third time period T3 and the fourth time period T4. The controller 6 is configured to, during the first and fourth time periods T1 and T4, modulate the bidirectional switch 2 out of conduction to interrupt the supply of electric power to the load 7 and cause the power supply 5 to perform the conversion operation. The controller 6 is configured to, during the second time period T2, modulate the bidirectional switch 2 into conduction to supply the electric power to the load 7 and stop the power supply 5 performing the conversion operation. The controller 6 is configured to, during the third time period T3, modulate the bidirectional switch 2 out of conduction to interrupt the supply of electric power to the load 7.

Here, "modulate . . . out of conduction" means causing the bidirectional switch 2 to be in an off-state. In addition, "modulate . . . into conduction" means causing the bidirectional switch 2 to be in an on-state. The "conversion operation" also means an operation for concerting the AC power supply 8 into the prescribed control power, namely an operation for producing the control power by electric power supplied from the AC power supply 8.

The dimmer 1 may further include the stopper 13 configured to be switched to cause the power supply 5 to perform and stop the conversion operation. In this case, for example, during the third time period T3, the stopper 13 may stop the power supply 5 performing the conversion operation while the controller 6 modulates the bidirectional switch 2 out of conduction to interrupt the supply of electric power to the load 7.

(1.4) Comparison with Comparison Example

Hereinafter, a comparison example is based on reverse phase control that is different from that of the present embodiment. Difference therebetween in case the control by the present embodiment and the control by the comparison example are compared will be explained with reference to the drawings.

Figure 3:
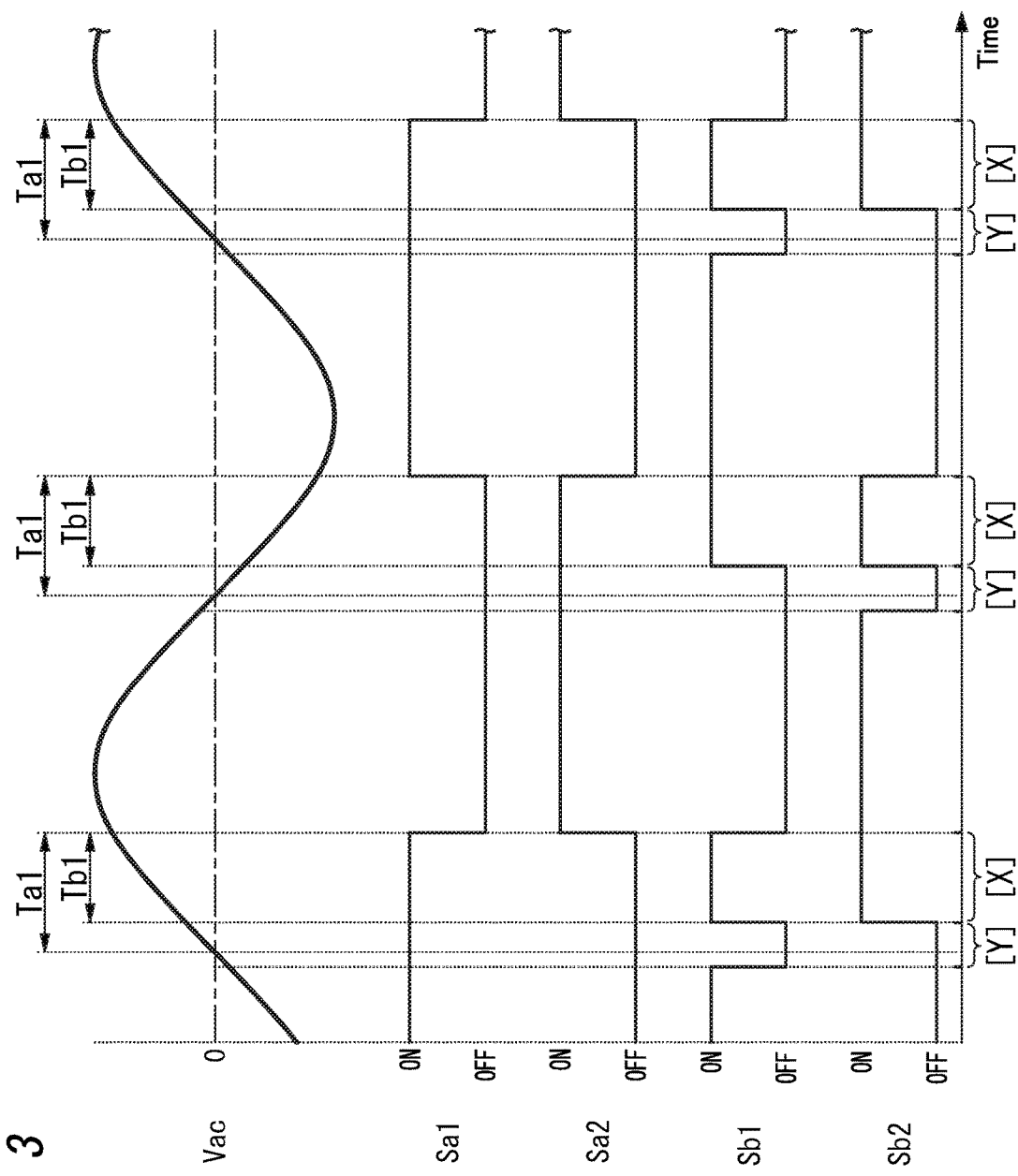
FIG. 3 is a timing chart used for comparing the dimmer according to Embodiment 1 and a comparison example.

Although the comparison example shown herein is different in controller (6)'s operation (control of bidirectional switch 2) from the present embodiment, the circuit configuration thereof is the same as that of the present embodiment. Therefore, like elements are assigned the same reference numerals as depicted in the present embodiment, and will be explained. FIG. 3 depicts the AC voltage "Vac", a first control signal "Sa1" and a second control signal "Sa2" of the comparison example, and the first control signal "Sb1" and the second control signal "Sb2" of the present embodiment.

A dimmer of the comparison example alternately causes the first and second control signals Sa1 and Sa2 to be "on" per cycle that is the same as that of the AC voltage Vac. With the comparison example, a bidirectional switch 2 conducts during a period of time during a switch device of switch devices Q1 and Q2 on a high potential side of the AC voltage Vac is turned on. That is, the comparison example performs what is called reverse control as shown in FIG. 3 where a pair of input terminals 11 and 12 conducts during a time period Ta1 from a zero cross point of the AC voltage Vac to an intermediate point in a half cycle thereof. Therefore, adjusting a phase difference between the first and second control signals Sa1 and Sa2 and the AC voltage Vac enables adjusting conduction time of the bidirectional switch 2.

As compared with the comparison example, the present embodiment has Difference 1 and Difference 2 below.

[Difference 1]

As shown in [X] of FIG. 3, the present embodiment includes a period of time during which the bidirectional switch 2 is in a bidirectional on-state (second time period T2), whereas the comparison example has no period of time during which the bidirectional switch 2 is in a bidirectional on-state.

That is, in the comparison example, the pair of input terminals 11 and 12 conducts as a result of the bidirectional switch 2 being in a unidirectional on-state (forward on-state), whereas in the present embodiment the pair of input terminals 11 and 12 conducts as a result of the bidirectional switch 2 being in a bidirectional on-state. Thus, in the dimmer 1 according to the embodiment, the bidirectional switch 2 is in a bidirectional on-state while the pair of input terminals 11 and 12 conducts, thereby enabling the suppression of a conduction loss by the bidirectional switch 2 in comparison with the comparison example where the bidirectional switch 2 is in a unidirectional on-state.

[Difference 2]

As shown in [Y] of FIG. 3, before and after a zero cross point of the AC voltage Vac, the present embodiment includes a period of time during which the bidirectional switch 2 is in a bidirectional off-state (first time period T1 or fourth time period T4), whereas the comparison example differs therefrom in that it does not have such a period of time.

That is, with the comparison example, the pair of input terminals 11 and 12 conducts during a time period Ta1 from a zero cross point of the AC voltage Vac to an intermediate point of a half cycle thereof, thereby making it possible to secure a chance of the supply of electric power from the AC power supply 8 to a power supply 5 only during latter part of the half cycle. There is however a possibility that an electric current will not flow through a load 7 during the latter part of the half cycle of the AC voltage Vac depending on a kind of the load 7, such as a load 7 to which a condenser input type lighting circuit is adopted. There is therefore a possibility that during a period of time during which the pair of input terminals 11 and 12 does not conduct, enough electric power to the power supply 5 cannot be secured from the AC power supply 8 because enough electric current cannot flow through the power supply 5. The comparison example may consequently be unable to maintain the supply of control power from the power supply 5 to a controller 6.

In contrast, the dimmer 1 according to the present embodiment causes the bidirectional switch 2 to be in a bidirectional off-state during the period of time from the start point of the half cycle (zero cross point) t0 to the first time point t1 (first time period T1), and therefore the period of time can be applied to the supply of electric power to the power supply 5. The dimmer 1 according to the embodiment is provided with a period of time during which the bidirectional switch 2 does not conduct during former part of the half cycle of the AC voltage Vac (first time period T1), thereby making it possible to secure a chance of the supply of electric power from the AC power supply 8 to the power supply 5 during the former part of the half cycle. The dimmer 1 according to the embodiment can therefore maintain the power supply of electric power from the AC power supply 8 to the power supply 5 for more kinds of loads 7 in comparison with the comparison example.

The dimmer 1 causes the bidirectional switch 2 to be in a bidirectional off-state even during a period of time from the third time point t3 to the end point of the half cycle t4 (fourth time period T4), and therefore the period of time can also be applied to the supply of electric power to the power supply

5. That is, the dimmer 1 is provided with the period of time during which the bidirectional switch 2 does not conduct even during the latter part of the half cycle (fourth time period T4), thereby making it possible to secure a chance of the supply of electric power from the AC power supply 8 to the power supply 5 even during the latter part of the half cycle.

(1.5) Advantages

As a control method of the dimmer, there is a positive phase control method (leading edge method) by which the pair of input terminals 11 and 12 is to conduct for a period of time from an intermediate point of each half cycle of the AC voltage Vac, besides the revers phase control method (trailing edge method). The revers phase control method is to start supplying electric power to the load 7 including (an) LED devices as a light source from each zero cross point, and it is therefore possible to reduce the distortion of current waveform when starting supplying the electric power. There are accordingly advantages of enabling an increase in the number of loads 7 allowed to be connected to the dimmer and the suppression of the occurrence of beat sound.

Although the dimmer 1 according to the present embodiment is basically on the basis of the revers phase control method, the dimmer 1 is provided with a chance of the supply of electric power from the AC power supply 8 to the power supply 5 during the former part in each half cycle of the AC voltage Vac. The supply of electric power to the load 7 starts at the first time point t1 when the first time from a zero cross point elapses, and there is therefore a possibility that the distortion of current waveform will be larger than that by the reverse phase control method like the above-mentioned comparison example. However, the influence of the distortion of current waveform is insignificantly small because an absolute value of the AC voltage Vac at the first time point t1 is not so large. On the other hand, there is an advantage of securing requisite control power for the operation of the controller 6 and enabling the stable operation.

The dimmer 1 according to the embodiment can reduce errors in detection by the phase detector 3 by causing the bidirectional switch 2 to be in a reverse on-state during a period of time from the second time point t2 to the third time point t3 (third time period T3). That is, voltage with polarity reverse to that of the AC voltage Vac (hereinafter referred to as "reverse polarity voltage") may be applied between the pair of input terminals 11 and 12 as a result of an absolute value of voltage across the load 7 exceeding the absolute value of the AC voltage Vac depending on the load 7. For example, such reverse polarity voltage is liable to occur in the case of a load 7 that voltage thereacross hardly decreases, such as a load 7 provided with a buffer capacitor having a comparatively large capacity. When the reverse polarity voltage occurs, the phase detector 3 may detect a zero cross point in error at a time point out of the zero cross points of the AC voltage Vac. In the case of a load 7 where according to the dimming level the reverse polarity voltage may occur or not, such a load 7 may have a sudden change in a zero cross point when the dimming level is varied. During the third time period T3, the bidirectional switch 2 is in a reverse on-state and therefore the occurrence of such reverse polarity voltage is suppressed. It is therefore possible to reduce errors in detection by the phase detector 3, caused by the reverse polarity voltage. Even during a period of time during which the bidirectional switch 2 is in a reverse on-state (third time period T3), the pair of input terminals 11 and 12 does not conduct, thereby enabling the application of the period of time to the supply of electric power to the power supply 5 by causing the disconnection signal to be an "ON" signal.

The dimmer 1 enables keeping the supply of electric power from the power supply 5 to the controller 6, thereby preventing abnormal operations such as blinking and flicker of the load 7.

The control of the bidirectional switch 2 according to the embodiment may be the control to the "forward on-state" instead of the "bidirectional on-state", or the control to the "bidirectional on-state" instead of the "forward on-state" in contrast. The control may also be the control to the "reverse on-state" instead of the "bidirectional off-state", or the control to the "bidirectional off-state" instead of the "reverse on-state". That is, an On or Off state of the bidirectional switch 2 needs to be unchanged.

As stated in the present embodiment, the bidirectional switch 2 is preferably configured to be switched to any one of a bidirectional off-state in which a bidirectional current between the input terminals 11 and 12 is cut off, a bidirectional on-state in which the bidirectional current is conducted, and a unidirectional on-state in which a unidirectional current between the input terminals 11 and 12 is conducted. In this case, the controller 6 is preferably configured to control the bidirectional switch 2 so that the bidirectional switch 2 is in a reverse on-state from the second time point t2 to the third time point t3 between the second time point t2 and the end point of the half cycle. The "reverse on-state" is a unidirectional on-state in which the bidirectional switch 2 allows an electric current to flow from an input terminal of the input terminals 11 and 12 on a low potential side of the AC power supply 8 to an input terminal of the input terminals 11 and 12 on a high potential side of the AC power supply 8. With the configuration, the occurrence of the reverse polarity voltage is suppressed from the second time point t2 to the third time point t3, thereby enabling reducing errors in detection by the phase detector 3 caused by the reverse polarity voltage.

As stated in the present embodiment, it is preferable that the power supply 5 have the capacitive device C1. With the configuration, the power supply 5 enables the capacitive device C1 to store electric power supplied from the AC power supply 8 during a period of time during which the input terminals 11 and 12 do not conduct. The power supply 5 can therefore secure control power for the controller 6 even during a period of time during which the input terminals 11 and 12 conduct. Note that the power supply 5 having the capacitive device C1 is not indispensable to the configuration of the dimmer 1. The capacitive device C1 may be omitted as appropriate.

As stated in the present embodiment, it is also preferable that the first time be a constant length of time. With the configuration, the controller 6 need cause the bidirectional switch 2 to be in a bidirectional off-state during a period of time (first time period T1) until the constant length of first time from a start point of each half cycle (zero cross point) t0 elapses. The processing of the controller 6 becomes easy in comparison with the cases where the length of the first time is varied.

Although the processing of the controller 6 becomes complicated, the length of the first time may be different between the first time period T1 in the positive half cycle and the first time period T1 in the negative half cycle.

As stated in the present embodiment, it is preferable that the phase detector 3 be configured to output a detection signal when detecting a zero cross point of the AC voltage Vac. In this case, more preferably the dimmer 1 further includes the mask processor 61 configured to, when receiving a detection signal from the phase detector 3, disable the detection signal over a constant length of mask time. The mask processor 61 in the embodiment is not indispensable to the configuration of the dimmer 1. The mask processor 61 may be omitted as appropriate.

As stated in the present embodiment, it is also preferable that the dimmer 1 further include the stopper 13 configured to stop the power supply 5 producing the control power during the stop time period. The stop time period is a period of time from which at least a period of time during which the bidirectional switch 2 is in an off-state is excluded. The stopper 13 in the embodiment is not indispensable to the configuration of the dimmer 1. The stopper 13 may be omitted as appropriate.

As stated in the present embodiment, it is also preferable that the bidirectional switch 2 include the switch devices Q1 and Q2 that are electrically connected in series between the pair of input terminals 11 and 12.

(1.6) Modified Examples (1.6.1) Modified Example 1

Figure 4:
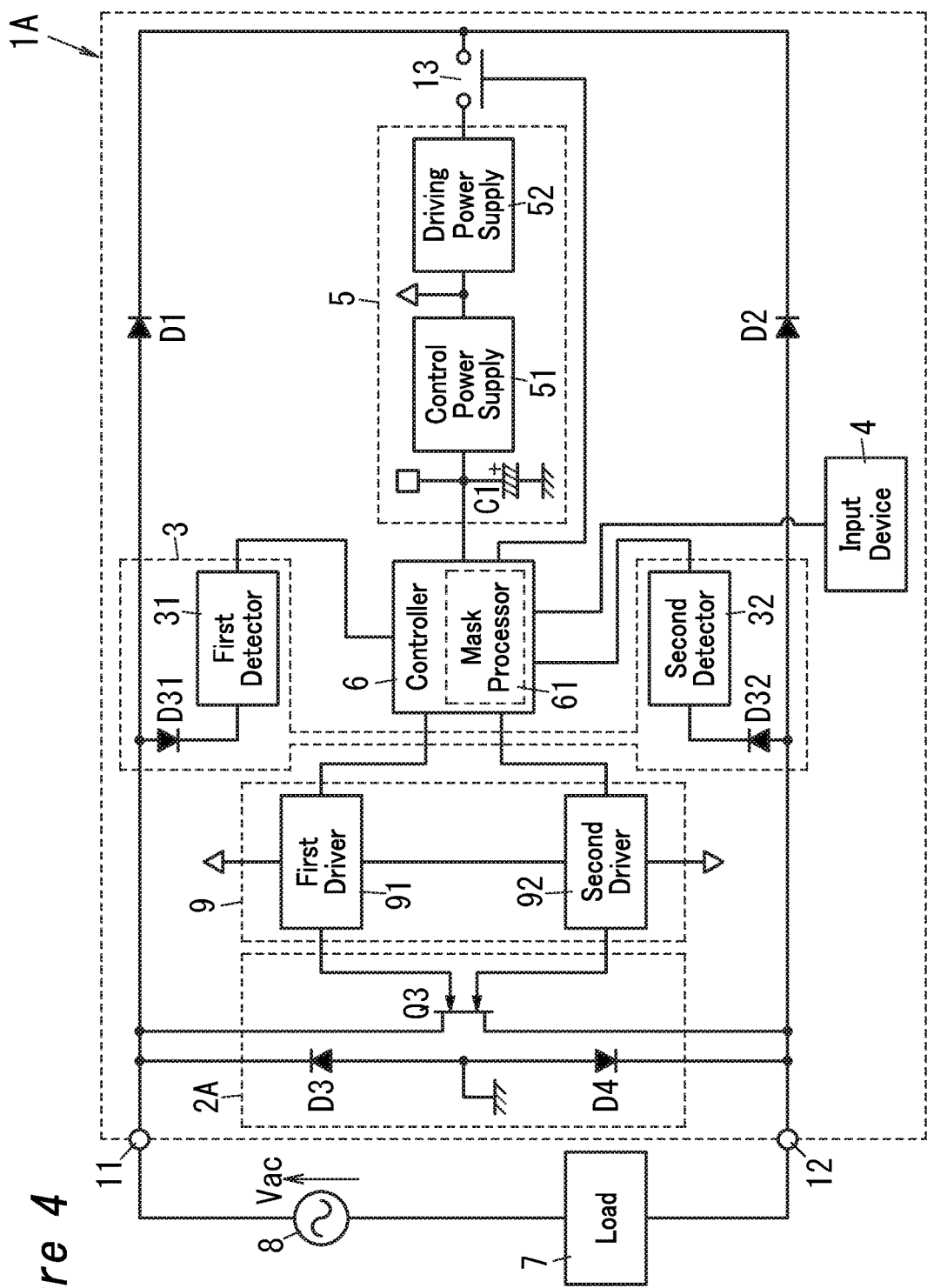
FIG. 4 is a schematic circuit diagram showing a configuration of a dimmer as Modified Example 1 of Embodiment 1.

As shown in FIG. 4, a dimmer 1A as Modified Example 1 according to Embodiment 1 is different in part corresponding to the bidirectional switch 2 from the dimmer 1 according to Embodiment 1. Hereinafter, like elements are assigned the same reference numerals as depicted in Embodiment 1, and explanation thereof is omitted as appropriate.

In the present modified example, a bidirectional switch 2A includes a switch device Q3 having double gate structure. The switch device Q3 is, for example a semiconductor switch having the double gate structure (dual gates) using a wide band gap of semiconductor material such as GaN (gallium nitride). The bidirectional switch 2A further includes a pair of diodes D3 and D4 that are connected in anti-series between input terminals 11 and 12. The diode D3 has a cathode that is connected to the input terminal 11 and the diode D4 has a cathode that is connected to the input terminal 12. Both the diodes D3 and D4 have respective anodes that are electrically connected to ground (earth) of a power supply 5. With the present modified example, the pair of diodes D3 and D4 along with a pair of diodes D1 and D2 constitute a diode bridge.

With the configuration of the modified example, the bidirectional switch 2A enables further reducing a conduction loss in comparison with the bidirectional switch 2.

(1.6.2) Modified Example 2

Figure 5:
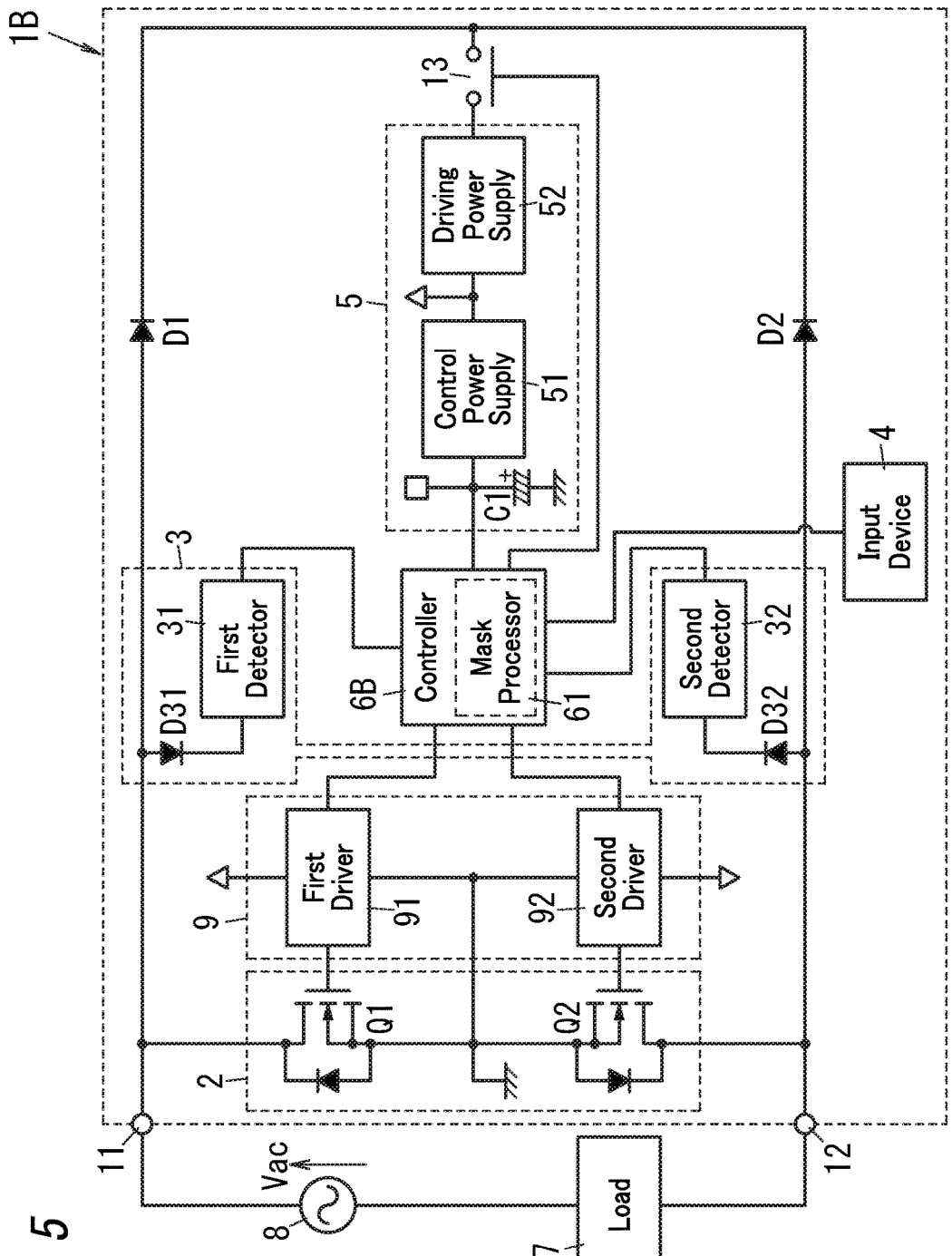
FIG. 5 is a schematic circuit diagram showing a configuration of a dimmer as Modified Example 2 of Embodiment 1.

As shown in FIG. 5, a dimmer 1B as Modified Example 2 according to Embodiment 1 differs from the dimmer 1 according to Embodiment 1 in that a controller 6B is configured to estimate a zero cross point of AC voltage Vac after a half cycle or more based on one detection signal of a zero cross point. A circuit configuration of the dimmer 1B is the same as that of the dimmer 1 according to Embodiment 1. Hereinafter, like elements are assigned the same reference numerals as depicted in Embodiment 1, and explanation thereof is omitted as appropriate.

A phase detector 3 is configured to output a detection signal when detecting a zero cross point of the AC voltage Vac, like Embodiment 1.

Figure 6:
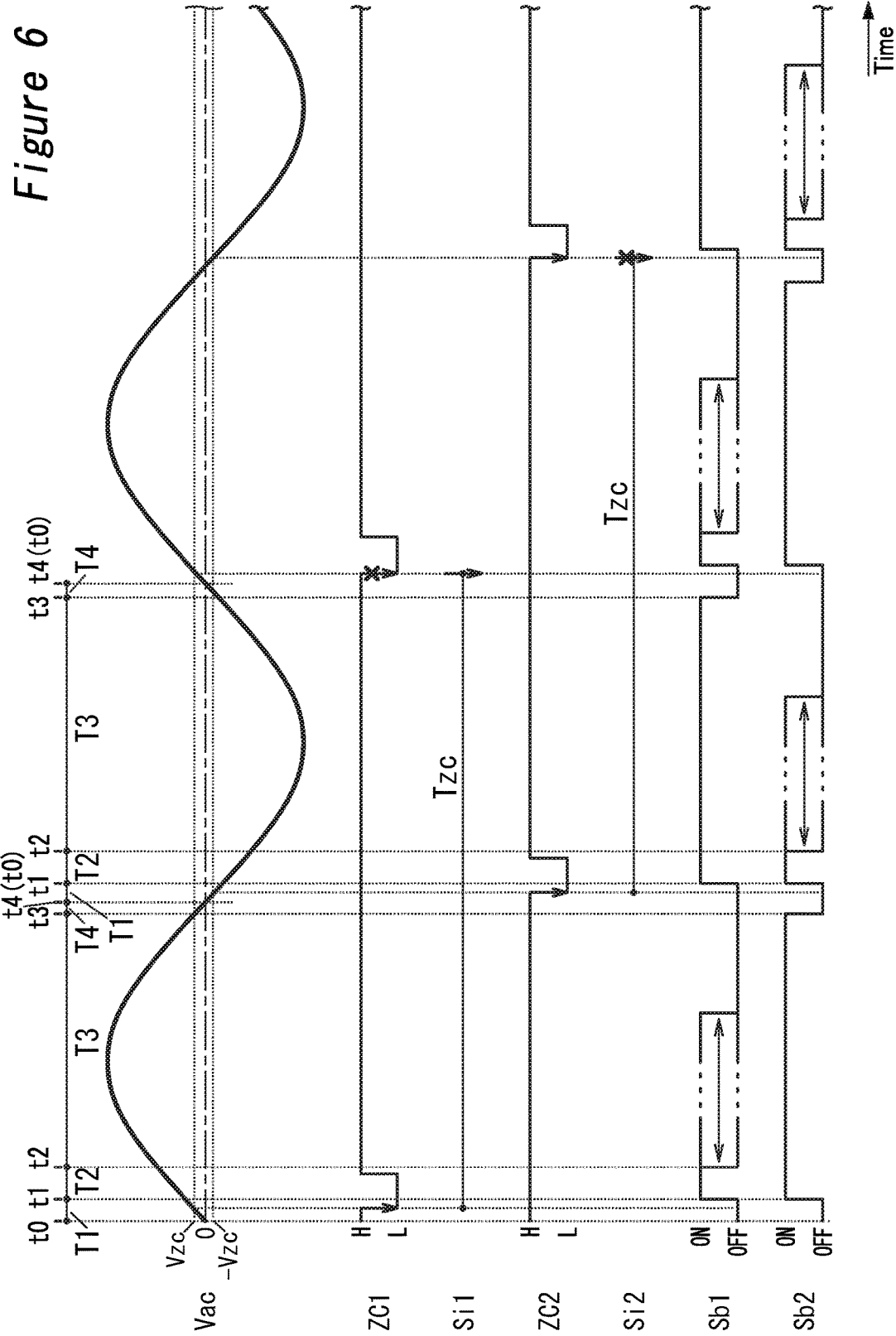
FIG. 6 is a timing chart showing an operation of the dimmer as Modified Example 2 of Embodiment 1.

In the modified example, the controller 6B is configured to, based on the frequency of the AC voltage Vac, whenever receiving a detection signal from the phase detector 3, estimate a zero cross point after a half cycle of the AC voltage Vac or more as a virtual zero cross point to generate a virtual signal at timing of the virtual zero cross point. Specifically, as shown in FIG. 6, the controller 6 generates a first virtual signal Si1 at a point in time when stand-by time Tzc corresponding to one cycle of the AC voltage Vac from the reception of a first detection signal ZC1 elapses. Similarly, the controller 6B generates a second virtual signal Si2 at a point in time when the stand-by time Tzc corresponding to one cycle of the AC voltage Vac from the reception of a second detection signal ZC2 elapses. Here, the stand-by time Tzc is set to be slightly longer than one cycle of the AC voltage Vac in order to prevent the first virtual signal Si1 from being generated prior to a next first detection signal ZC1. The stand-by time Tzc is also set to be slightly longer than one cycle of the AC voltage Vac in order to prevent the second virtual signal Si2 from being generated prior to a next second detection signal ZC2.

The controller 6B obtains a logical sum of the first detection signal ZC1 and the first virtual signal Si1 as a trigger signal for determining the control timing of a bidirectional switch 2. Similarly, the controller 6B obtains a logical sum of the second detection signal ZC2 and the second virtual signal Si2 as a trigger signal for determining the control timing of the bidirectional switch 2. The controller 6B can determine the control timing of the bidirectional switch 2 based on the virtual signals as trigger signals generated at the virtual zero cross points in place of a detection signal from the phase detector 3 even when the phase detector 3 fails to detect a zero cross point.

The controller 6B may be configured to estimate twice or more a virtual zero cross point with respect to one detection signal of the zero cross point. In this case, the controller 6B generates a virtual signal whenever the stand-by time Tzc elapses from a point in time when a detection signal is received. Here, the length of the stand-by time Tzc may be varied so that a first stand-by time Tzc is slightly longer than one cycle of the AC voltage Vac and a second stand-by time Tzc is almost the same as one cycle of the AC voltage Vac.

The stand-by time Tzc for generating a virtual signal may be set on the basis of the half cycle of the AC voltage Vac as a standard. Examples of the standard may include a half cycle, three times the length of a half cycle (i.e., 1.5 cycles), four times the length of a half cycle (i.e., 2 cycles) or more besides on cycle. When the length of the stand-by time Tzc is set to odd times the length of the half cycle as a standard, the controller 6B generates a second virtual signal Si2 at a point in time when the stand-by time Tzc elapses based on a first detection signal ZC1. In this case, the controller 6B also generates a first virtual signal Si1 at a point in time when the stand-by time Tzc elapses based on a second detection signal ZC2. The controller 6B may therefore configured to generate first and second virtual signals Si1 and Si2 from only one of first and second detection signals ZC1 and ZC2.

With the configuration of the present modified example, the controller 6B performs stable reverse phase control in phase with the cycle of the AC voltage Vac even when the phase detector 3 fails to detect a zero cross point due to the influence of random noise or the like, or even when a zero cross point is shifted owing to an instantaneous drop of the AC voltage Vac.

(1.6.3) Other Modified Examples

Hereinafter, modified examples of Embodiment 1, exclusive of Modified Examples 1 and 2 described above will be detailed.

The dimmers of Embodiment 1 and Modified Examples 1 and 2 described above are not limited to a load 7 with (an) LED devices as a light source, but may be applied to a light source that is equipped with a capacitor input type circuit and has a high impedance and is lit by a small electric current. Examples of this sort of light source include an organic EL (Electroluminescence) device and the like. The devices may be applied to loads 7 as various light sources such as discharge lamps.

The switch driver 9 is not indispensable to the configuration of the dimmer 1, but may be omitted as appropriate. When the switch driver 9 is omitted, the controller 6 directly drives the bidirectional switch 2.

The mask processor 61 needs to be configured to disable a detection signal over a constant length of mask time, but is not limited to the configuration integrally provided with the controller 6. That is, the mask processor 61 may be integrally provided with, for example the phase detector 3. In this case, the mask processor 61 stops the operation of the phase detector 3 over the mask time, and thereby the detection signal can be disabled. The mask processor 61 may be provided separately from the controller 6 and the phase detector 3.

The mask time need be time that is set in advance on the basis of a half cycle of the AC voltage Vac, but is not limited to the time that is slightly shorter than twice the length of the half cycle (i.e., one cycle) as exemplified in Embodiment 1. For example, the mask time may be time slightly shorter than the half cycle, or time slightly shorter than three times the length of the half cycle (i.e., 1.5 cycles). The mask time may also be set on the basis of four times the length of the half cycle (i.e., 2 cycles) or more.

Each of the switch devices Q1 and Q2 constituting the bidirectional switch 2 is not limited to an n-channel enhancement MOSFET, but may be, for example, IGBT (Insulated Gate Bipolar Transistor) or the like. The rectifying devices for the unidirectional on-states (diodes) in the bidirectional switch 2 are not limited to the body diodes of the switch devices Q1 and Q2, but may be discrete diodes like Modified Example 1. The diodes may be built in a package identical to the switch devices Q1 and Q2.

The first time need be a constant length of time, and the length thereof may be set as appropriate. For example, when the first time period T1 is the sum of a period of time from a start point of a half cycle (zero cross point) t0 to a detection point and a period of time from the detection point to a point in time when a constant delay time therefrom elapses, the delay time is not limited to 300 [μs], but is appropriately set in a range of 0 [μs] to 500 [μs].

The third time point t3 need be before an end point of the half cycle (zero cross point) t4, and the length of time from the third time point t3 to the end point of the half cycle t4 may be set appropriately. For example, when the length of time from the detection point to the third time point t3 is shorter by a constant specified time than the half cycle, the specified time is not limited to 300 [μs], but is appropriately set in a range of 100 [μs] to 500 [μs].

The stop time period during which the stopper 13 electrically disconnects the power supply 5 from the pair of input terminals 11 and 12 need be a period of time from which at least a period of time during which the bidirectional switch 2 is in a bidirectional off-state (first time period T1 or fourth time period T4) is excluded. Therefore, the stop time period is not limited to the period of time whose start and end points are a point in time between the first and second time points t1 and t2 and the third time point t3, respectively, but for example, the start point of the stop time period may be the first time point t1 or the end point of the stop time period may be before the third time point t3.

The stopper 13 needs to be configured to stop the power supply 5 producing the control power during the stop time period. The stopper 13 is therefore not limited to the configuration where the power supply 5 producing the control power is stopped by disconnecting the power supply 5 from at least one of the pair of input terminals 11 and 12, or by controlling the semiconductor switch device included in the power supply 5. For example, the stopper 13 may be configured to stop the output of the power supply 5 (output of control power) to increase the input impedance of the power supply 5, thereby stopping the power supply 5 producing the control power.

The diodes D1 and D2 in the present embodiment are not indispensable to the configuration of the dimmer 1. The diodes D1 and D2 may be omitted as appropriate.

(Embodiment 2)

Figure 7:
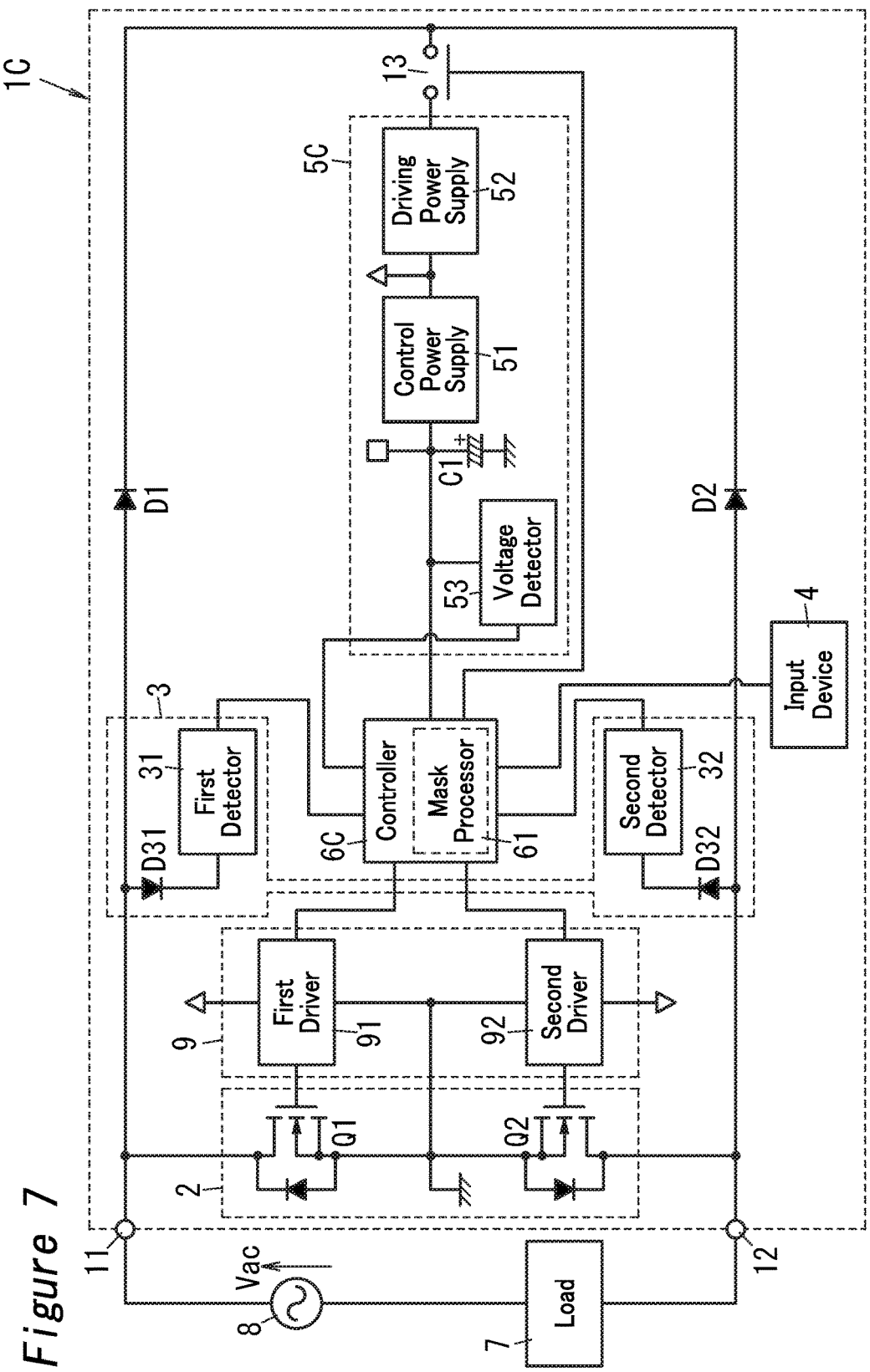
FIG. 7 is a schematic circuit diagram showing a configuration of a dimmer according to Embodiment 2.

As shown in FIG. 7, a dimmer 1C according to the present embodiment differs from the dimmer 1 according to Embodiment 1 in that it further includes a voltage detector 53 configured to detect (measure) voltage of control power (voltage across capacitive device C1). Hereinafter, like elements are assigned the same reference numerals as depicted in Embodiment 1, and explanation thereof is omitted as appropriate.

In the present embodiment, first time is not a constant length of time, but time from a start point of a half cycle of AC voltage Vac (zero cross point) t0 to a point in time when voltage detected with the voltage detector 53 (voltage across capacitive device C1) reaches a prescribed threshold. That is, the first time in the embodiment is not a fixed length of time but a variable length of time that varies according to a detection value by the voltage detector 53.

Specifically, a power supply 5C is provide with the voltage detector 53. The voltage detector 53 is configured to detect voltage across the capacitive device Cl of the power supply 5C to provide a detection value to a controller 6C. The controller 6C is configured to, after receiving a detection signal from a phase detector 3, compare the detection value from the voltage detector 53 with the prescribed threshold and determine that a point in time when the detection value reaches the threshold is a point in time when the first time elapses (i.e., first time point t1). Here, the threshold is set to voltage across the capacitive device Cl when the capacitive device Cl has been charged such that the operation of the controller 6C until at least an end point of the half cycle of the AC voltage Vac (zero cross point) t4 can be secured.

As explained above, the dimmer 1C according to the present embodiment further includes the voltage detector 53 configured to detect voltage of control power, and the first time is the time from a start point of a half cycle to a point in time when voltage detected with the voltage detector 53 reaches the prescribed threshold. With the embodiment, the controller 6C can cause a bidirectional switch 2 to be in a bidirectional on-state at a point in time when the capacitive device Cl is charged such that requisite control power for the operation of the controller 6C can be secured. The dimmer 1C according to the embodiment therefore enables shortening, to the utmost, the time from the start point of the half cycle of the AC voltage Vac (zero cross point) t0 to a point in time when input terminals 11 and 12 conduct while securing the requisite control power for the operation of the controller 6C. The capacitive device Cl may be parasitic capacitance. In this case, the configuration has no discrete capacitive device.

The other configurations and functions are the same as those of Embodiment 1. The configuration of the present embodiment may be applied by being combined with each configuration explained in Embodiment 1 (including modified examples).

(Other Embodiments)

Embodiment 1 (including modified examples) and Embodiment 2 as described above secure the supply of electric power from the AC power supply 8 to the power supply 5 over before and after a start point of a half cycle of the AC voltage Vac (zero cross point) t0 (first time period T1 or fourth time period T4), but are not limited to this.

The supply of electric power from the AC power supply 8 to the power supply 5 may be secured during constant time only after the start point of the half cycle of the AC voltage Vac (zero cross point) t0 (first time period T1). The supply of electric power from the AC power supply 8 to the power supply 5 may also be secured during constant time only before the start point of the half cycle of the AC voltage Vac (zero cross point) t0 (fourth time period T4). In these cases, the first or fourth time period T1 or T4 is set with the supply of electric power from the AC power supply 8 to the power supply 5 secured preferentially. There is therefore an occasion in which a second time period T2 during which electric power is supplied to a load 7 according to a dimming level received through an input device 4 is not set. An example of the occasion includes a user's operation through an operation device, by which the light output of the load 7 is set to be maximum.

The abovementioned constant time is set so that enough supply of electric power from the AC power supply 8 to the power supply 5 is performed, thereby enabling the suppression of the distortion of current waveform and a stable operation of a controller 6.

REFERENCE SIGNS LIST 1, 1A, 1B, 1C Dimmer
2, 2A Bidirectional Switch
3 Phase Detector
4 Input Device
5, 5C Power Supply
6, 6B, 6C Controller
7 Load
8 AC Power Supply
11 Input Terminal
12 Input Terminal
13 Stopper
53 Voltage Detector
61 Mask Processor
C1 Capacitive Device
Q1 Switch Device
Q2 Switch Device
Q3 Switch Device
t0 Start point of half cycle (zero cross point)
t1 First time point
t2 Second time point
t3 Third time point
t4 End point of half cycle (zero cross point)
Vac AC voltage
ZC1 First detection signal
ZC2 Second detection signal

The invention claimed is:

1. A dimmer, comprising
a pair of input terminals that is configured to be electrically connected between a load configured to be lit when it is energized, and an AC power supply,
a bidirectional switch that is configured to be switched so as to conduct and interrupt a bidirectional current between the pair of input terminals,
a phase detector that is configured to detect a phase of AC voltage of the AC power supply,
an input device that is configured to receive a dimming level representing a value of light output of the load,
a power supply that is electrically connected between the pair of input terminals and configured to receive electric power from the AC power supply to produce control power, and
a controller that is configured to receive the control power from the power supply to be activated, the controller being configured to control the bidirectional switch based on a detection signal from the phase detector so that
the bidirectional switch is in an off-state from a start point of a half cycle of the AC voltage to a first time point when first time therefrom elapses,
the bidirectional switch is in an on-state from the first time point to a second time point when second time therefrom according to the dimming level elapses, and
the bidirectional switch is in an off-state from the second time point to an end point of the half cycle, wherein
the bidirectional switch is configured to be switched to any one of
a bidirectional off-state in which the bidirectional current between the pair of input terminals is interrupted,
a bidirectional on-state in which the bidirectional current is conducted, and
a unidirectional on-state in which a unidirectional current is conducted, and
the controller is configured to control the bidirectional switch so that from the second time point to a third time point between the second time point and the end point of the half cycle, the bidirectional switch is in the unidirectional on-state, in a direction of which the bidirectional switch allows an electric current to flow from an input terminal of the pair of input terminals on a low potential side of the AC power supply to an input terminal of the pair of input terminals on a high potential side of the AC power supply.

2. The dimmer of claim 1, wherein the first time is a constant length of time.

3. The dimmer of claim 1, further comprising a voltage detector configured to detect voltage of the control power, wherein
the first time is time from the start point of the half cycle to a point in time when the voltage detected with the voltage detector reaches a prescribed threshold.

4. The dimmer of claim 1, wherein the power supply has a capacitive device.

5. The dimmer of claim 1, wherein
the phase detector is configured to output the detection signal when detecting a zero cross point of the AC voltage, and
the dimmer further comprises a mask processor configured to disable the detection signal over a constant length of mask time when receiving the detection signal from the phase detector.

6. The dimmer of claim 1, further comprising a stopper configured to stop the power supply producing the control power during a stop time period,
the stop time period being a period of time from which at least a period of time during which the bidirectional switch is in the off-state is excluded so that the stop time period is set in a range from the first time point to the third time point.

7. The dimmer of claim 1, wherein
the phase detector is configured to output the detection signal when detecting a zero cross point of the AC voltage, and
the controller is configured to estimate a zero cross point of the AC voltage after the half cycle or more based on one detection signal.

8. The dimmer of claim 1, wherein the bidirectional switch includes two switch devices that are electrically connected in series between the pair of input terminals.

9. The dimmer of claim 1, wherein the bidirectional switch includes a switch device having double gate structure.

10. A dimmer, comprising
a bidirectional switch that is configured to be connected to an AC power supply with the bidirectional switch connected in series to a load, the bidirectional switch being configured to perform phase control of AC voltage of the AC power supply to be supplied to the load,
a phase detector that is configured to detect a phase of the AC voltage of the AC power supply,
a power supply that is connected in parallel with the bidirectional switch, the power supply being configured to perform conversion operation to convert the AC power supply into prescribed control power, the power supply having a capacitive device configured to store the control power, and
a controller that is configured to receive the control power through the capacitive device from the power supply, the controller being configured to divide each half cycle of the AC voltage into a first time period, a second time period, a third time period and a fourth time period based on the phase detected with the phase detector, the controller being further configured to
during the first and fourth time periods, modulate the bidirectional switch out of conduction to interrupt supply of electric power to the load, and cause the power supply to perform the conversion operation,
during the second time period, modulate the bidirectional switch into conduction to supply electric power to the load, and stop the power supply performing the conversion operation, and
during the third time period, modulate the bidirectional switch out of conduction to interrupt the supply of electric power to the load.

* * * * *